United States Patent [19]

Runnels et al.

[11] Patent Number: 5,783,497

[45] Date of Patent: Jul. 21, 1998

[54] FORCED-FLOW WAFER POLISHER

[75] Inventors: Scott Runnels; Anthony J. Toprac, both of Austin, Tex.

[73] Assignee: Sematech, Inc., Austin, Tex.

[21] Appl. No.: 284,316

[22] Filed: Aug. 2, 1994

[51] Int. Cl.⁶ .................................................. H01L 21/00
[52] U.S. Cl. .................................................. 438/747; 438/745
[58] Field of Search .......................... 156/637.1, 662.1, 156/636.1; 216/90, 83, 89; 451/36, 60; 437/225; 438/745, 747

[56] References Cited

U.S. PATENT DOCUMENTS

| | | | |
|---|---|---|---|
| 2,922,264 | 1/1960 | Mushrush | 51/281 |
| 3,436,286 | 4/1969 | Lange | 156/17 |
| 3,629,023 | 12/1971 | Strehlow | 156/17 |
| 3,979,239 | 9/1976 | Walsh | 156/4 |
| 4,141,180 | 2/1979 | Gill, Jr. et al. | 51/5 |
| 4,193,226 | 3/1980 | Gill, Jr. et al. | 51/124 |
| 4,240,231 | 12/1980 | Day | 51/138 |

(List continued on next page.)

FOREIGN PATENT DOCUMENTS

| | | |
|---|---|---|
| 2 063 961 | 7/1971 | France . |
| 1 521 794 | 10/1969 | Germany . |
| 253 706 A1 | 1/1988 | Germany . |
| 43 04 429 A1 | 9/1993 | Germany . |
| 53-68493 | 6/1978 | Japan . |
| 62-04323 | 1/1987 | Japan . |
| 1-268032 | 10/1989 | Japan . |
| 1 437934 | 6/1976 | United Kingdom . |
| 1 443 299 | 7/1976 | United Kingdom . |

OTHER PUBLICATIONS

IBM Technical Disclosure Bulletin, Sep. 1963, vol. 6, No. 4, pp. 5–6. "Electropolishing Semiconductor Wafers".

"Controlled Wafer Backside Polishing"; J.S. Basi and E. Mendel; IBM Technical Disclosure Bull. vol.21, No.7; Dec. 78; p. 2733.

"Wafer Thinning and Chemical Polishing Machine"; J.R. Hause and R.C. Kverek; IBM Technical Disclosure Bull., vol.23, No.9; Feb. 1981; pp. 4141–4142.

"Chemical lathe for the efficient preparation of high quality surfaces for low–cycle fatigue"; Bober et al.; Rev.Sci.Instrum., 51(12); Dec. 1980 pp. 1690–1693.

"A Two–Dimensional Process Model for Chemimechanical Polish Planarization"; J. Warnocki; J. Clectrochem. Soc., vol. 138, No. 8; Aug. 1991; pp. 2398–2402.

"Feature–Scale Fluid–Based Erosion Modeling for Chemical–Mechanical Polishing"; S.R. Runnels; et al. J. Electrochem. Soc., vol. 141, No. 7; Jul. 1994; pp. 1900–1904.

"Tribology Analysis of Chemical–Mechanical Polishing"; S.R. Runnels et al. J. Electrochem. Soc., vol. 141, No. 6; Jun. 1994; pp. 1698–1701.

"Characterization of Mechanical Planarization Process"; Renteln et al.; VMIC Conference; Jun. 12–13, 1990; pp. 57–63.

"A Bowl Feed and Double Sides Polishing for Silicon Wafer for VLSI"; Nakamura et al.; Bull. Japan Soc. of Prec. Engg., vol. 19, No. 2; Jun. 1985; pp. 120–125.

"Fundamental Mechanics of Fluids"; I.G. Currie; McGraw Hill Book Company; NY; 1974; mostly pp. 3–36 and pp. 224–227.

"Chemical Polishing of Cadmium Sulfide"; M.V. Sullivan et al.; J. Electrochem. Soc., vol. 114, No. 3; Mar. 1967; pp. 295–297.

"Chemomechanical Polishing of CdS"; V.Y. Pickhardt et al.; J. Electrochem. Soc.,vol. 121, No.8; Aug. 1974; pp. 1064–1066.

*Primary Examiner*—Thi Dang
*Attorney, Agent, or Firm*—William W. Kidd

[57] ABSTRACT

A forced-flow polishing technique forcibly flows slurry across the surface of a wafer. The slurry and the wafer are contained in a confined space so that the slurry flow is between a fixed upper and lower boundaries. The slurry flow places selective stress on wafer features such that taller surfaces are eroded at a faster rate. The constant flow allows for uniformity in achieving the selective erosion across the wafer surface.

5 Claims, 3 Drawing Sheets

U.S. PATENT DOCUMENTS

| | | | |
|---|---|---|---|
| 4,244,775 | 1/1981 | D'Asaro | 156/636 |
| 4,256,535 | 3/1981 | Banks | 156/645 |
| 4,270,314 | 6/1981 | Cesna | 51/131 |
| 4,319,432 | 3/1982 | Day | 51/131 |
| 4,373,991 | 2/1983 | Banks | 156/645 |
| 4,435,247 | 3/1984 | Basi et al. | 156/636 |
| 4,448,634 | 5/1984 | Lampert | 156/636 |
| 4,519,168 | 5/1985 | Cesna | 51/216 |
| 4,600,469 | 7/1986 | Fusco et al. | 156/636 |
| 4,645,561 | 2/1987 | Rea | 156/636 |
| 4,720,938 | 1/1988 | Gosis | 51/131 |
| 4,805,348 | 2/1989 | Arai et al. | 51/118 |
| 4,826,563 | 5/1989 | Hassett et al. | 156/636 |
| 4,841,680 | 6/1989 | Hoffstein et al. | 51/283 |
| 4,842,678 | 6/1989 | Noro et al. | 156/636 |
| 4,860,498 | 8/1989 | Gosis | 51/165 |
| 4,879,258 | 11/1989 | Fisher | 437/225 |
| 4,910,155 | 3/1990 | Cote et al. | 437/8 |
| 4,916,868 | 4/1990 | Wittstock | 51/281 |
| 4,927,432 | 5/1990 | Budinger et al. | 51/298 |
| 4,940,507 | 7/1990 | Harbarger | 156/636 |
| 4,954,141 | 9/1990 | Takiyama et al. | 51/296 |
| 4,959,113 | 9/1990 | Roberts | 156/636 |
| 4,974,370 | 12/1990 | Gosis | 51/111 |
| 5,032,203 | 7/1991 | Doy et al. | 156/345 |
| 5,094,037 | 3/1992 | Hakomori et al. | 51/165 |
| 5,096,854 | 3/1992 | Saito et al. | 437/225 |
| 5,097,630 | 3/1992 | Maeda et al. | 51/50 |
| 5,099,614 | 3/1992 | Arai et al. | 51/165 |
| 5,104,828 | 4/1992 | Morimoto et al. | 437/225 |
| 5,123,218 | 6/1992 | Karlsrud | 51/281 |
| 5,137,544 | 8/1992 | Medellin | 51/308 |
| 5,157,876 | 10/1992 | Medellin | 51/281 |
| 5,177,908 | 1/1993 | Tuttle | 51/283 |
| 5,196,353 | 3/1993 | Sandhu et al. | 437/8 |
| 5,205,082 | 4/1993 | Shendon et al. | 51/283 |
| 5,209,816 | 5/1993 | Yu et al. | 156/636 |
| 5,212,910 | 5/1993 | Breivogel et al. | 51/398 |
| 5,216,843 | 6/1993 | Breivogel et al. | 51/131 |
| 5,225,034 | 7/1993 | Yu et al. | 156/636 |
| 5,232,875 | 8/1993 | Tuttle et al. | 437/225 |
| 5,234,867 | 8/1993 | Schultz et al. | 437/225 |
| 5,240,552 | 8/1993 | Yu et al. | 156/636 |
| 5,245,790 | 9/1993 | Jerbic | 51/121 |
| 5,245,796 | 9/1993 | Miller et al. | 51/283 |
| 5,246,525 | 9/1993 | Sato | 156/345 |
| 5,257,478 | 11/1993 | Hyde et al. | 51/131 |
| 5,267,418 | 12/1993 | Currie et al. | 51/216 |

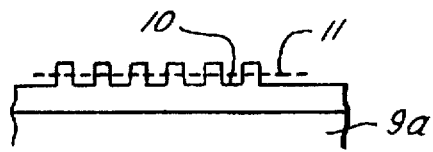
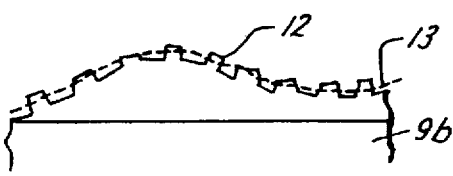
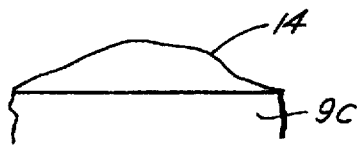
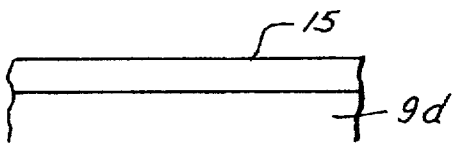
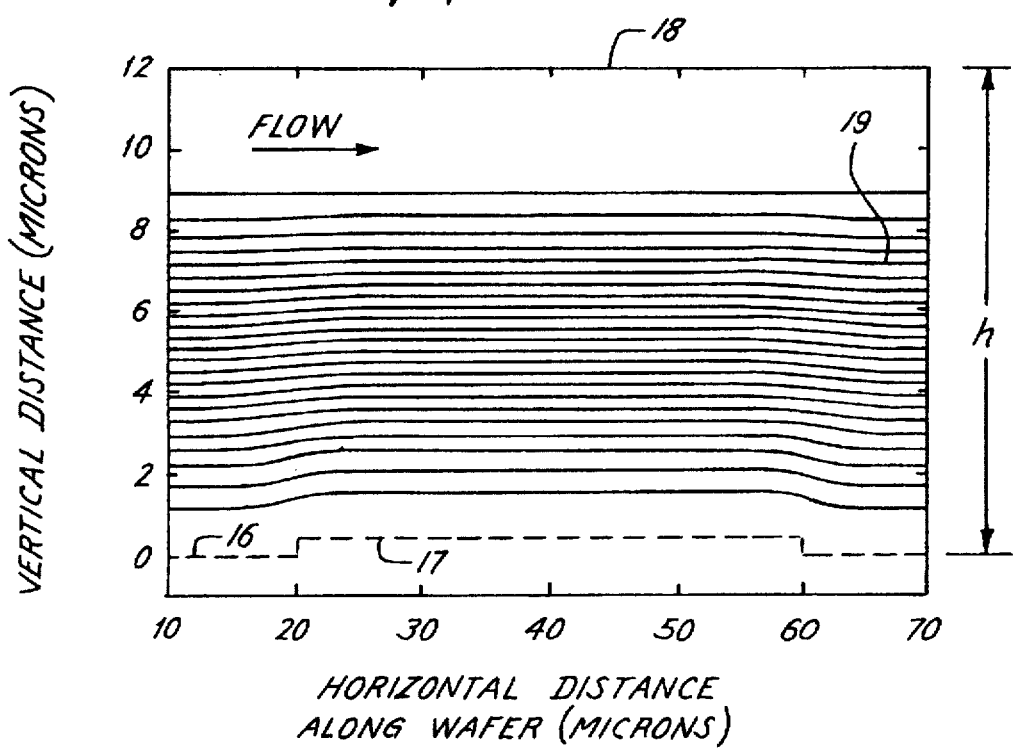

5,783,497

1

FORCED-FLOW WAFER POLISHER

BACKGROUND OF THE INVENTION

1. Field of the Invention

The present invention relates to the field of semiconductor manufacturing techniques and, more particularly, to a technique for planarizing semiconductor wafers.

2. Prior Art

The art is abound with references pertaining to techniques for polishing a surface. Various semiconductor polishing techniques today can be traced back to the polishing methods employed to polish optical lenses. Similar techniques have been utilized in the semiconductor field to polish bare wafers, which are then used as the base substrate for manufacturing integrated circuit devices. Thus, a number of methods are known in the prior art for polishing bare wafers, such as a silicon wafer.

The manufacture of an integrated circuit device requires the formation of various layers (both conductive and non-conductive) above the base substrate to form the necessary components and interconnects. During the manufacturing process, removal of a certain layer or portions of a layer must be achieved in order to pattern and form the various components and interconnects. Generally this removal process is termed "etching" or "polishing."

One of the techniques available for etching is the chemical-mechanical polishing (CMP) process in which a chemical slurry is used along with a polishing pad. The mechanical movement of the pad relative to the wafer provides the abrasive force for removing the exposed surface of the wafer. Because of the broad surface area covered by the pad in most instances, CMP is utilized to planarize a given layer. Planarization is a method of treating a surface to remove discontinuities, such as by polishing (or etching), thereby "planarizing" the surface.

It has been theorized that abrasive material removal from a semiconductor wafer surface requires actual pad-wafer contact for proper CMP to occur. Another theory states that the actual material removal is achieved by the pad pressure on a hydrodynamic layer which is generally the slurry disposed between the wafer and the pad. However, what is known is that the presence of the slurry is required for obtaining optimum results in performing CMP.

A variety of techniques and tools for performing CMP are well-known in the prior art. U.S. Pat. Nos. 4,141,180 and 4,193,226 are just two examples of earlier schemes. After initial usage of CMP in semiconductor planarization, the practice lost ground to other forms of etching. The industry generally favored the usage of dry techniques, such as ion and plasma etching. However, with the advent of larger wafer sizes and smaller sub-micron devices being formed on these wafers, CMP is again being viewed in favorable light as one of the preferred techniques available for planarization. U.S. Pat. Nos. 5,245,790 and 5,245,796 are just two examples of more recent interest in the CMP technology.

However, the application of existing CMP tools and methods to the new generation of sub-micron devices has amplified previously known problems or created new ones. Due to the smaller dimensions, including the usage of thinner semiconductor layers, tighter tolerances are now needed. Where certain tolerances were permitted with the older generation devices, these tolerances are no longer acceptable. Additionally it is preferred to obtain process uniformity while performing CMP from one wafer to the next.

2

A major difficulty with the prior art techniques is in maintaining a consistent combination of even slurry distribution between the wafer and pad along with uniform abrasion of the exposed wafer surface. Because of the difficulty in controlling the amount of slurry present between the wafer and the pad, it is difficult to maintain a steady and consistent control on the planarization process. Although a number of approaches have been devised, such as cutting grooves in the pad, process control is still lacking.

Therefore, it is appreciated that a novel technique for attempting to control and better predict the planarization process parameters is desirable. This is especially true as the technology for developing future generations of memory devices, such as 256 Megabytes and 1 Gigabyte DRAMs and beyond, are exploited. The present invention addresses this need.

SUMMARY OF THE INVENTION

A forced-flow polishing method and apparatus for achieving planarization is described. An upper boundary constraint is placed on a slurry layer, so that the slurry is disposed between the wafer surface and the upper boundary condition. The fixed distance between the wafer and the upper boundary provides for a controlled and confined area for slurry distribution. The slurry is then made to flow in this region thereby providing for a controlled hydrodynamic layer above the wafer.

The slurry is made to flow in order to selectively polish the wafer surface. The stresses applied to the wafer surface by the flowing slurry are dependent on the topology of the surface. Taller features extending into the slurry flow are closer to the upper boundary, wherein larger stresses are applied. Shorter features extend less into the slurry flow and, therefore, receive less stress. Thus, based on the height differential, taller features etch faster than shorter features.

The amount of the erosion can be controlled by controlling the design parameters surrounding the slurry flow, as well as the materials being used for the slurry. The selective nature of the erosion provides for local planarization control and the uniform slurry flow over the surface of the wafer provides for global uniformity in polishing the wafer.

ECONOMIC ADVANTAGE

The practice of the present invention permits for improved controls in performing CMP. Such improvements allow for the manufacture of next generations of semiconductor devices and, further, has a potential for improving the product yield and reducing manufacturing costs.

BRIEF DESCRIPTION OF THE DRAWINGS

FIG. 1 is a cross-sectional view of a wafer surface having a non-planar local profile and a planar global profile.

FIG. 2 is a cross-sectional view of a wafer surface having a non-planar local profile and a non-planar global profile.

FIG. 3 is a cross-sectional view of a wafer surface having a planar local profile and a non-planar global profile.

FIG. 4 is a cross-sectional view of a wafer surface having a planar local profile and a planar global profile.

FIG. 5 is a cross-sectional view showing flow streamlines across a wafer surface.

DETAILED DESCRIPTION OF THE PREFERRED EMBODIMENTS

Figure 6:
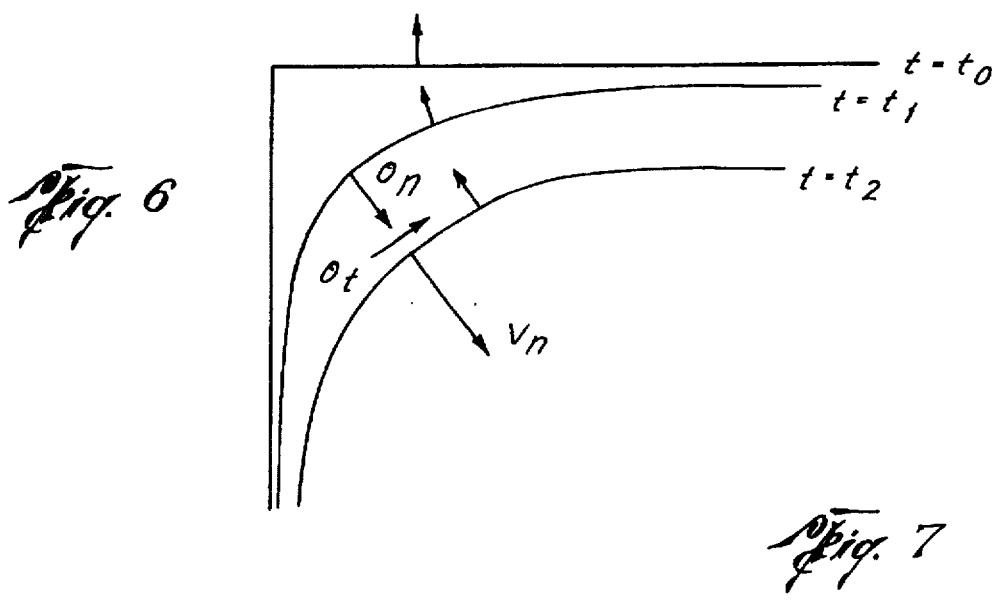
FIG. 6 is a cross-sectional view showing stress on a wafer feature over time.

The present invention pertains to a method and apparatus for planarizing layers on a semiconductor wafer by the use of a forced-flow polishing technique. In the following description, numerous specific details are set forth, such as specific shapes, materials, structures, compositions, etc., in order to provide a thorough understanding of the present invention. However, it will be obvious to one skilled in the art that the present invention may be practiced without these specific details. In other instances, well known processes and structures have not been described in detail in order not to unnecessarily obscure the present invention.

To understand the nature of the present invention, as well as its applications in planarizing a semiconductor wafer, certain principle concepts must first be understood. It is to be appreciated that a purpose of the present invention is to obtain both local and global planarity through the practice of the present invention in order to provide optimum results in planarization. That is, for an ideal planarization process, both local and global planarity should be optimized. Local planarity is defined as the difference in height between the wafer's neighboring (adjacent) high and low profiled surfaces. Global planarity is defined as the variation in the mean height of the various features over the whole of the surface being planarized.

Referring to FIGS. 1–4, illustrations exemplifying the different aspects of planarity are shown. FIG. 1 shows a surface layer 10 of a wafer 9a (typically a surface, such as surface 10, is formed on a wafer substrate and may be referred to as a surface, layer or wafer), in which surface 10 has a non-planar local profile, but a globally planar profile. Surface 10 has neighboring regions of high and low features that present a noticeable difference in height from one another, which will result in local surface variations and/or discontinuity and which will cause the local planarity to be non-planar. However, the mean feature height (shown as dotted line 11) above the substrate 9a is substantially constant, thus, resulting in a planar global profile.

FIG. 2 shows a surface layer 12 above substrate 9b, in which surface 12 does not have local or global planarity. Similar to surface 10 of FIG. 1, surface 12 has adjacently located non-planar features having local surface variations and/or discontinuity. Furthermore, due to the variations in the mean feature height (shown as dotted line 13) of surface 12, global planarity is not present as well. Surface 12 represents the least desirable profile, since no planarity is present.

FIG. 3 shows a surface layer 14 above substrate 9c, in which surface 14 has local planarity, but not global planarity. Local planarity is achieved due to the lack of height variations and/or discontinuity between the neighboring regions. The local transition is rather smooth. However, due to the mean feature height of surface 14 above wafer 9c not being relatively constant, global planarity is not present.

FIG. 4 shows a surface layer 15 above substrate 9d, in which surface 15 represents the desirable profile. Due to the substantially flat profile of surface 15, local and global planarities are present. No local height variations and/or discontinuities are present, thereby resulting in a locally planar profile. The mean height of surface 15 above wafer 9d is substantially constant, thereby resulting in a globally planar profile. Surface 15 is the most desirable of the four examples shown in FIGS. 1–4. It is to be appreciated that an object of the present invention is to address the need for obtaining both local and global planarity in planarizing a surface, particularly a surface layer on a semiconductor wafer. Another object of the present invention is to polish a wafer surface to obtain a uniformly polished profile, both locally and globally.

In typical CMP schemes for "etching" (polishing or planarizing) a surface, specially designed slurries are utilized. The full nature of the advantages of using such slurries is not completely understood, but it is imperative that such slurries be present for performing the CMP. Thus, these slurries are also a necessary component in practicing the present invention.

Although prior art CMP techniques may perform the etching to obtain a desired result, in many instances such results are obtained only after extensive experimentation. Repeatability of desirable polishing results is difficult to achieve, since parameters determinative of the polishing process are not completely understood or are difficult to control. Essentially, prior art CMP techniques fail to control three of the essential operating conditions to obtain an optimally planarized surface when polishing a surface. Thus, another object of the present invention is to control these three operating parameters in order to obtain both local and global planarity when planarizing a surface.

The three operating conditions which must be controlled in order to practice the present invention are: (1) a uniform slurry distribution to a surface being planarized; (2) an application of a selective stress to the surface, where the stress field is dependent on the height of a given feature; and (3) a uniform application of the selective stress field over the entire wafer. A selective stress field is selective in that it exerts stress relative to the height of the profiled features. This application of selective stress will achieve local planarity since taller features will be made to erode more rapidly than shorter features. However, this selective stress field must be applied uniformly over the whole surface in order to achieve global planarity.

A presence of a hydrodynamic slurry layer during polishing is demonstrated by performing a three-dimensional fluid-flow calculation for the slurry between a pad and a wafer during CMP (See for example, I. G. Currie, "Fundamental Mechanics of Fluids," McGraw-Hill Book Company, 1974 and Scott Runnels et al., "Tribology Analysis Of Chemical-Mechanical Polishing," Journal of the Electrochemical Society, Vol. 141 No. 6, June 1994, pp. 1698–1701). Numerical solutions show that a hydrodynamic layer thickness of approximately 65 microns supports typical CMP loading. The flow of the slurry over an individual wafer feature may be approximated by a two-dimensional fluid-flow calculation. For the two-dimensional analysis, the applicable equations are the steady-state two-dimensional Navier-Stokes equations for incompressible Newtonian flow. Using well-known index notation where free indices range from 1 to 2 (horizontal $(x_1)$ and vertical $(x_2)$ directions) and repeated indices indicate summation from 1 to 2, the governing equations for the two-dimensional velocity vector $U_i$, where $i=1,2$ can be written as:

$$(\rho U_j)(\partial U_i/\partial X_j) = -(\partial P/\partial X_i) + \mu(\partial^2 U_i/\partial X_j \partial X_j) \quad \text{(Eq. 1)}$$

$$\partial U_i/\partial X_i = 0 \quad \text{(Eq. 2)}$$

where $\rho$ is the slurry density, $\mu$ is the slurry viscosity, P is the pressure (of the fluid flow) and $U_i$ is the slurry velocity in the $X_i$ (i=1,2) direction at any point in the flow.

It should be noted that when the three-dimensional analysis is performed for the presence of the hydrodynamic layer, a third vector ($x_3$) is employed in the calculation of Equations 1 and 2. That is, the same Equations 1 and 2 are used but $x_i$ (i=1,2,3) directions are calculated for solving the three-dimensional problem.

Thus, boundary conditions for a slurry flow are illustrated in FIG. 5. Referring to FIG. 5, a wafer surface 16 has a raised surface 17 which is to be etched. An upper boundary, such as a pad 18 resides above wafer 16 and surface 17 with a layer of slurry 19 disposed there between. The pad 18 has a relative pad motion horizontal to the wafer 16. A height h denotes a distance between the pad 18 and wafer 16. Slurry flow occurs across the wafer 16 surface 17 and in FIG. 5 is noted to flow from right (inlet) to left (outlet). Although the illustration shows a two-dimensional profile to understand the two-dimensional analysis, it is appreciated that the flow of the slurry occurs across the fully exposed surface of the wafer, such wafer surface having a dimension in the $x_3$-direction (direction in and out of the paper in the Figure).

Typical approximate boundary values for the example of FIG. 5 are as follows. The pad velocity Vp is 0.42 m/s, the slurry density $\rho$ is 997 kg/m$^3$ and the slurry viscosity $\mu$ is $0.8908 \times 10^{-3}$ kg/ms. Choosing h as the characteristic length (of approximately 1 micron), the Reynolds number (Re) is approximately equal to 0.5 (Re=$\rho$Vph/$\mu$). This small value for Re implies that the flow field around the feature 17 will be symmetric and the pressure will be anti-symmetric.

The flow equations are solved numerically using the mixed formulation of the well-known Galerkin finite element method. The resulting mildly nonlinear discrete equations are linearized in an explicit time marching scheme described below. The linear sets of equations are solved using an adaptation of Hood's frontal solver. It should be stressed again that the three-dimensional analysis is employed for wafer scale calculations for determining the properties of the hydrodynamic layer. The two-dimensional model is used for feature scale calculations for determining the properties of feature erosion. Accordingly, application of the above formulation results in a theory of the present invention in which feature erosion is determined due to slurry-induced stresses. The analysis is better understood with an illustration.

Referring to FIG. 6, a feature that is to be planarized, such as feature 17 of FIG. 5, is shown at three time intervals. The uneroded feature 17 is shown at time t0. Once slurry flow occurs across the feature 17, stress induced by the slurry flow causes the feature 17 to erode. The magnitudes of the normal stress ($\sigma_n$) and the shear stress ($\sigma_t$) on feature 17 are shown in FIG. 6. The erosion of the feature due to the stresses are exemplified at two time intervals $t_1$ and $t_2$. The magnitudes of the normal and shear stresses are given by:

$$\sigma_n = |\sigma_{ij} n_i n_j| \qquad (Eq. 3)$$

$$\sigma_t = |\sigma_{ij} n_i \tau_j| \qquad (Eq. 4)$$

The two-dimensional stress tensor is noted as:

$$\sigma_{ij} = -P\delta_{ij} + \mu((\partial U_j/\partial X_i) + (\partial U_i/\partial X_j)) \qquad (Eq. 5)$$

wherein $\delta_{ij}$ is the Kronecke delta, $\sigma_{11}$ and $\sigma_{12}$ are the normal stresses in the $X_1$ and $X_2$ directions, $n_i$ is the outward normal to the wafer feature surface and $\tau_i$ ($\tau_1 = n_2$, $\tau_2 = -n_1$) is the wafer feature surface tangent vector in the two directions.

The erosion of the surface is described in terms of the surface stresses using an erosion principle of the present invention, which states that the feature erodes in a direction normal to itself at a rate Df velocity Vn (Vn is illustrated in FIG. 6). The calculation for the rate of erosion Vn normal to the feature being polished is given by the following equation.

$$Vn = KP(\sigma_t + D\sigma_t^2), \qquad (Eq. 6)$$

where K and D empirically represent chemical and fracturing effects as noted below. The definitions of P and $\sigma_t$ are noted above. Verification of Equation 6 can be achieved by integrating it in time with the flow over the feature being recalculated as the feature erodes, as noted by changes in Equation 5 and then by comparing the predicted profiles to experimental values.

The K-D values are empirical values that depend on the material being eroded and the type of slurry being used. Such values are empirically derived from prior uses of such combinations. K-D values must be obtained through experimentation if such values are not already known from prior use. Essentially, K and D are variables for fitting a particular erosion profile. Various K and D value combinations are tried to fit the resulting profile to a particular erosion profile. Thus, some empirical experimentation is necessary for a given etching process in order to solve for the K and D values.

Utilizing the erosion characterization of Equation 6, optimum local planarization can be achieved for use with a given hydrodynamic slurry layer. Erosion profiles are then computed for several hydrodynamic layer thicknesses. The hydrodynamic layer thickness is the distance between the two solid boundaries (lower and upper boundaries in FIG. 5) and is presumed to vary as the feature is eroded away. By utilizing the quantitative analysis of the present invention, strict control limits can be placed on the erosion and, hence, the planarization process.

For example, the selectivity for a square wave shaped pattern profile 17 of FIG. 5 can be defined as:

$$S(z) = A(z)/A(0) \qquad (Eq. 7)$$

where A=A(z) is the distance between upper and lower surfaces as a function (z) of the material, such as an oxide layer, being removed. Function (z) is the material removed from the top of the feature. The erosion profiles thus exhibit a S(z) function. The planarization rate $r_p$ is defined to be the negative of the slope of a linear approximation to log(S(r)) and this function is graphically illustrated in FIG. 7.

Figure 7:
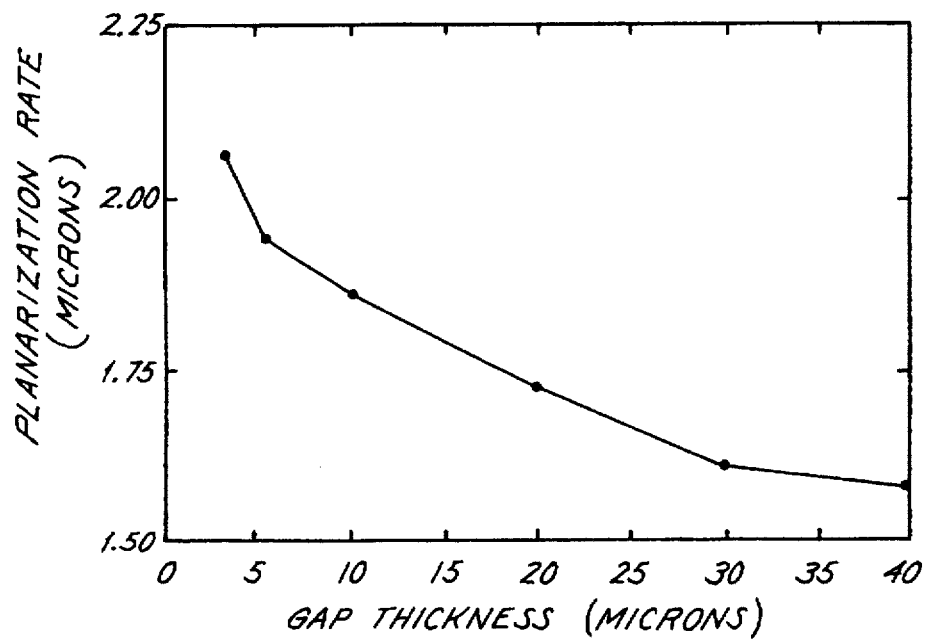
FIG. 7 is a graphic illustration showing planarization rate versus gap thickness when slurry is forced across the surface of a wafer.

As noted by FIG. 7, the planarization rate is dependent on the slurry gap thickness, which gap is typically the space between the wafer surface and the upper boundary 18, such as the polishing pad. Thus, a method of the present invention optimizes the planarization process by controlling the three operating conditions noted earlier. A uniform slurry distribution is made to be present over the surface of a wafer. A selective stress field application is applied to provide the local planarity and a uniform application of the selective stress field is maintained over the wafer in order to provide global planarity.

The practice of the present invention requires that a uniform slurry distribution be maintained during the planarizing process with the intent of maintaining the mean thickness of the slurry layer substantially as a constant over the overall wafer surface to obtain global planarization. However, locally, the slurry must exert a selective stress field in order to remove taller profile features at a faster rate. The selective stress field ensures that local planarization is achieved.

It is appreciated that a variety of techniques can be implemented to achieve the controls required by the present invention. Current CMP techniques can be adapted, although at great effort, to place finer controls on the required parameters. Although prior art CMP pads can be manipulated to control these factors, in practice it is difficult to maintain the controlling parameters at the desired values. Difficulty lies in the complexity of maneuvering the mechanical polisher and the pad. Thus, a preferred method and apparatus for practicing the present invention is described below.

Figure 8:
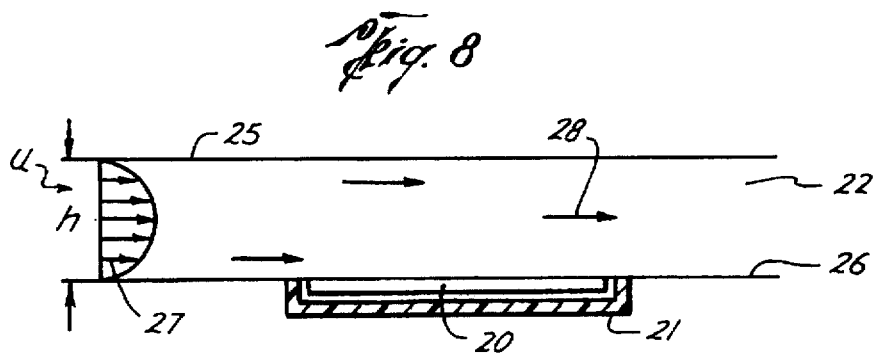
FIG. 8 is a cross-sectional diagram showing a method of the present invention in which a wafer is positioned for forced slurry flow to occur over the exposed wafer surface.

Referring to FIG. 8, a slurry 28 is made to flow over a surface of wafer 20. As shown, the wafer 20 is placed on a wafer holder 21, such as a wafer platen or a chuck. The wafer holder 21 is not critical to the operation of the preferred embodiment, as long as the wafer is supported. The wafer is positioned in a duct or channel 22, which is used for the flow and containment of the slurry 28. The internal dimensions of the channel 22 should be such as to maintain a flow of the slurry 28 at a substantially constant bulk speed (U) during planarization of the wafer 20. The channel 22 should be of sufficient dimension to overlie the wafer surface which is being planarized. Typically, it is the complete wafer surface that is being planarized. The wafer 20 should be positioned so that the surface to be polished is proximal to the boundary of the channel 22, so as not to appreciably disrupt the bulk flow speed of the slurry. It should be noted that channel 22 is fully enclosed so that the slurry 28 is disposed within a confined space.

Figure 9:
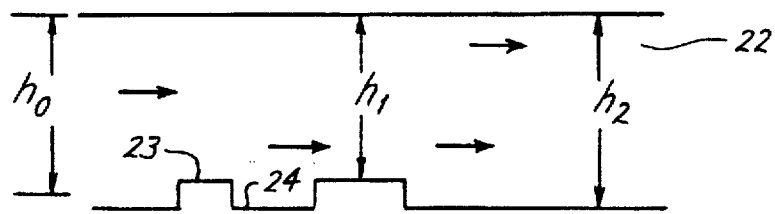
FIG. 9 is an enlarged view showing a portion of the wafer surface of FIG. 8.

Referring also to FIG. 9, an enlarged view of a portion of the wafer 20 adjacent to the flowing slurry 28 is shown. Local features of the wafer 20 are shown having peaks 23 and valleys 24. Since the channel 22 is contained in a fixed medium, there is a fixed boundary for channel 22.

Accordingly, an upper boundary 25 is imposed above the wafer surface. Thus, once the wafer 20 is positioned in channel 22, a mean thickness ($h_0$) of the slurry above wafer 20 results. A smaller gap ($h_1$) occurs between a taller profiled feature 23, while a larger gap ($h_2$) occurs between a shallower profiled feature 24. The stress placed on the feature surfaces is larger on the higher surface 23 than it is on the lower surface 24. Thus, taller features 23 will "etch" at a faster rate than the shallower features 24. Such selectivity results in achieving local planarization.

If the upper and bottom boundaries 25 and 26 are essentially flat, when the wafer is positioned so that the mean gap $h_0$ is generally level with the bottom 26 of the channel 22, the fluid dynamics of the wafer surface and the slurry 28 in the channel 22 behave essentially as two flat surfaces. A velocity profile 27 between the upper 25 and bottom 26 surfaces is essentially parabolic in shape, which is the shape of profile 27. The actual velocity profile will deviate from parabolic, depending on the surface profile of the wafer 20 and its exact position within channel 22. Flow profile is exemplified in the streamlines of FIG. 5. Slurry transport speed U, composition of the slurry 28 and distance h, will determine the stress field exerted on the various features.

Figure 10:
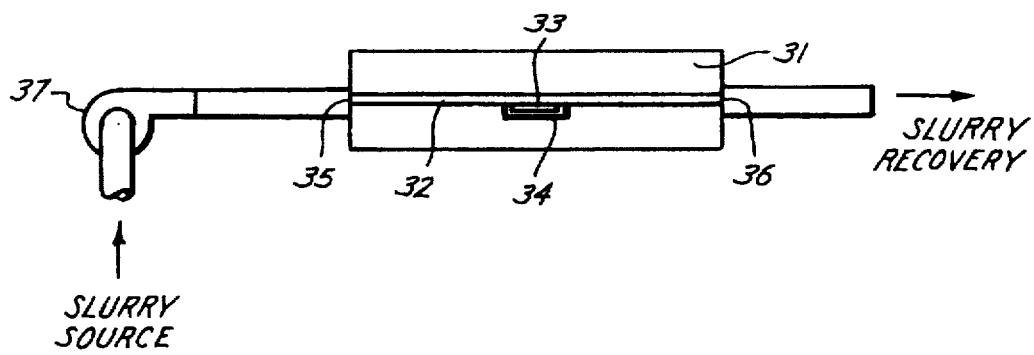
FIG. 10 is a schematic diagram of an apparatus of the present invention in which slurry is forced through an enclosed channel containing a wafer which is to be polished.
Figure 11:
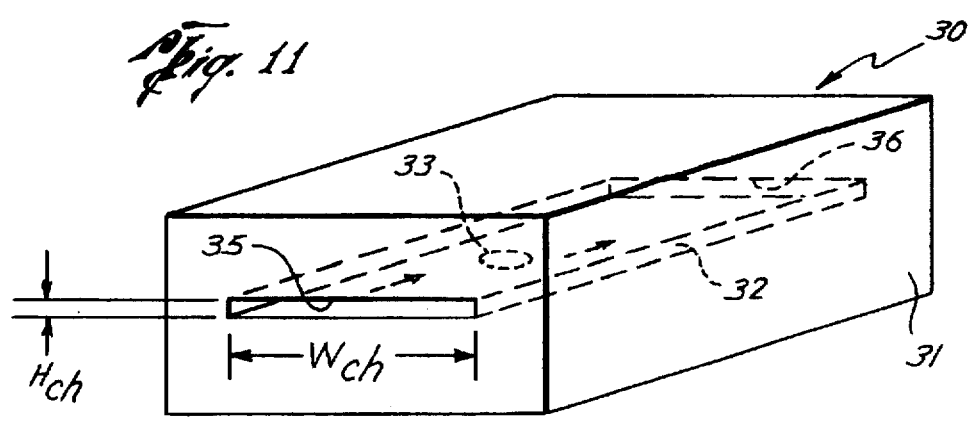
FIG. 11 is a pictorial diagram of the apparatus of the present invention shown in FIG. 10.

Referring to FIGS. 10 and 11, an apparatus of the present invention is shown. The apparatus is a forced-flow polisher 30 in which a rectangular-shaped channel 32 is formed within housing 31. Channel 32 is equivalent to the channel 22 shown in FIG. 8. A wafer 33 is disposed on a support means 34, such as a chuck or a platen, similar to that described in reference to FIG. 8. An inlet 35 to channel 32 is coupled to a slurry pump 37, which pumps slurry from a slurry source. The pump 35 maintains a substantially continuous flow of slurry at the required slurry bulk speed U. An outlet 36 of channel 32 is coupled to a slurry recovery system for recovering the slurry, or alternatively to waste.

It should be noted that the pressure distribution in the flow varies linearly on the wafer if the wafer remains stationary. The effect of this linear variation can be minimized by rotating the wafer relative to the slurry flow. Placing the wafer 33 on a rotating wafer chuck will permit the wafer to be rotated.

Thus, polisher 30 provides the three necessary conditions in practicing the present invention. Uniform slurry distribution to the wafer under a regulated flow rate determined by the force of bulk speed U, application of a selective stress field which is dependent on the feature profile and the uniform application of the selective stress field over the complete surface of the wafer.

The actual dimensions of the apparatus 30, including the width Wch and the height HChof the opening of channel 32, are strictly a design choice. However the following should be considered for proper design of apparatus 30 of the present invention. The channel 32 height Hch may be varied based on the maximum height variation in the wafer and the smoothness of the channel top surface. The smoothness of the top boundary is a concern in maintaining a substantially uniform flow of slurry.

For a wafer whose mean height is fairly constant and a channel top surface whose total height variation is around 5 microns, a channel height $H_{ch}$ of 20 to 50 microns will be adequate. The channel width WCh is less critical and can be set to 1.5×wafer diameter. Slurry will need to be pumped through the channel at a sufficient and uniform rate U pursuant to the earlier mentioned formulation.

The apparatus described above provides for selective stress application and uniform slurry transport as required by the operating conditions of the present invention. This particular apparatus provides for well-controlled stress field to be exerted on the wafer surface; uniform and predictable slurry transport; easier scalability to larger wafer sizes; and requires no polishing pads.

Thus by the application of the analysis of the present invention, a much more controlled environment can be achieved to planarize layers on a surface, such as a semiconductor wafer, especially a silicon wafer. Selective local polishing is achieved, while uniformity of such selective polishing is achieved across the whole wafer.

It should also be noted that the present invention can be readily adapted to other areas of technology, such as in the manufacture of flat panel video displays. It is to be appreciated that the method of the present invention can be adapted for use with prior art CMP tools as well, which currently rely on the use of polishing pads. The difficulty, however, lies in the placement of the pad to provide a substantially constant upper boundary, while slurry flow is maintained uniformly between the wafer and the pad.

We claim:

1. A method of providing selective erosion of a material layer having higher and lower profile features fabricated on a surface of a semiconductor material in order to uniformly planarize said material layer, comprising the steps of:

placing said semiconductor material in a confined channel having an enclosed boundary and wherein said semiconductor material is disposed within said channel;

flowing a chemical slurry within said channel and across said material layer of said semiconductor material at a set pressure and flow rate;

wherein distance of said channel separating said semiconductor material and a boundary opposite said material layer is sufficiently narrow to impose varying hydrodynamic stress on features present on said material layer, said stress being inversely related to a distance between a given feature and its opposite boundary, such that higher profiled features of said material layer are subjected to relatively higher stress than lower profiled features and are selectively eroded at a faster rate than said lower profiled features in order to uniformly planarize said material layer.

2. The method of claim 1 wherein said erosion rate of a particular feature of said material layer is dependent on slurry flow pressure and shear stress placed on said feature.

3. A method of providing selective erosion of a material layer fabricated on a surface of a semiconductor wafer in order to obtain local and global planarization of said material layer, comprising the steps of:

placing said wafer in a confined channel having an enclosed boundary and wherein said wafer is disposed within said channel;

flowing a chemical slurry within said channel and across said material layer of said wafer at a set pressure and flow rate;

wherein distance of said channel separating said wafer and a boundary opposite said material layer is sufficiently narrow to impose varying hydrodynamic stress on features present on said material layer, said stress being inversely related to a distance between a given feature and its opposite boundary, such that higher profiled features of said material layer are subjected to relatively higher stress than lower profiled features and are selectively eroded at a faster rate than said lower profiled features in order to uniformly planarize said material layer.

4. The method of claim 3 wherein said erosion rate of a particular feature of said material layer is dependent on slurry flow pressure and shear stress placed on said feature.

5. The method of claim 4 further including the step of rotating said wafer during said slurry flow to uniformly distribute said slurry across said wafer.

* * * * *

UNITED STATES PATENT AND TRADEMARK OFFICE
CERTIFICATE OF CORRECTION

PATENT NO. : 5,783,497
DATED : Jul. 21, 1998
INVENTOR(S) : Runnels, et al.

It is certified that error appears in the above-identified patent and that said Letters Patent is hereby corrected as shown below:

In the Abstract:

line 4 "between a fixed upper and lower"
   should be --between fixed upper and lower"

col. 3, l. 24, "principle concepts"
   should be --principal concepts-- col. 5, l 49, "at time to"
   should be --at time $t_0$-- col. 8, l. 17, "width Wch and the height Hchof"
   should be --width $W_{ch}$ and the height $H_{ch}$ of-- col. 8, l. 28, "width Wch"
   should be --width $W_{ch}$--

Signed and Sealed this

First Day of December, 1998

Attest:

BRUCE LEHMAN

Attesting Officer

Commissioner of Patents and Trademarks